United States Patent
Suzuki

(10) Patent No.: US 7,279,421 B2
(45) Date of Patent: Oct. 9, 2007

(54) METHOD AND DEPOSITION SYSTEM FOR INCREASING DEPOSITION RATES OF METAL LAYERS FROM METAL-CARBONYL PRECURSORS

(75) Inventor: Kenji Suzuki, Guilderland, NY (US)

(73) Assignee: Tokyo Electron Limited, Tokyo (JP)

( * ) Notice: Subject to any disclaimer, the term of this patent is extended or adjusted under 35 U.S.C. 154(b) by 325 days.

(21) Appl. No.: 10/996,144

(22) Filed: Nov. 23, 2004

(65) Prior Publication Data

US 2006/0110918 A1    May 25, 2006

(51) Int. Cl.
*H01L 21/44* (2006.01)

(52) U.S. Cl. .......... 438/680; 438/663; 438/686; 257/E21.17; 257/E21.021; 257/E21.311; 257/E21.324

(58) Field of Classification Search .......... 438/680, 438/681, 683, 685, 686, 687, 679, 663
See application file for complete search history.

(56) References Cited

U.S. PATENT DOCUMENTS

| | | | |
|---|---|---|---|
| 4,929,468 A | 5/1990 | Mullendore | |
| 4,938,999 A | 7/1990 | Jenkin | |
| 6,303,809 B1 | 10/2001 | Chi et al. .......... | 556/136 |
| 6,319,832 B1 | 11/2001 | Uhlenbrock et al. .......... | 438/681 |
| 6,440,495 B1 | 8/2002 | Wade et al. .......... | 427/250 |
| 6,444,263 B1 * | 9/2002 | Paranjpe et al. .......... | 427/250 |
| 6,605,735 B2 | 8/2003 | Kawano et al. .......... | 556/136 |
| 6,713,373 B1 | 3/2004 | Omstead .......... | 438/608 |
| 6,989,321 B2 * | 1/2006 | Yamasaki et al. .......... | 438/584 |
| 7,078,341 B2 * | 7/2006 | Yamasaki et al. .......... | 438/680 |

(Continued)

FOREIGN PATENT DOCUMENTS

EP      0620291 A1    10/1994

(Continued)

OTHER PUBLICATIONS

Wang et al.; Low-temperature chemical vapor deposition and scaling limit of ultrathin Ru films, Applied Physics Letters, Feb. 23, 2004, pp. 1380-1382, vol. 84, No. 8, American Institute of Physics, Melville, NY.

(Continued)

*Primary Examiner*—David Nhu
(74) *Attorney, Agent, or Firm*—Wood, Herron & Evans, LLP

(57) ABSTRACT

A method and a deposition system for increasing deposition rates of metal layers from metal-carbonyl precursors using CO gas and a dilution gas. The method includes providing a substrate in a process chamber of a processing system, forming a process gas containing a metal-carbonyl precursor vapor and a CO gas, diluting the process gas in the process chamber, and exposing the substrate to the diluted process gas to deposit a metal layer on the substrate by a thermal chemical vapor deposition process. The deposition system contains a substrate holder configured for supporting and heating a substrate in a process chamber having a vapor distribution system, a precursor delivery system configured for forming a process gas containing a metal-carbonyl precursor vapor and a CO gas and for introducing the process gas to the vapor distribution system, a dilution gas source configured for adding a dilution gas to the process gas in the process chamber, and a controller configured for controlling the deposition system during exposure of the substrate to the diluted process gas to deposit a metal layer on the substrate by a thermal chemical vapor deposition process.

45 Claims, 4 Drawing Sheets

U.S. PATENT DOCUMENTS

| | | | |
|---|---|---|---|
| 2003/0129306 A1 | 7/2003 | Wade et al. | 427/255.28 |
| 2004/0105934 A1 | 6/2004 | Chang et al. | 427/255.28 |
| 2005/0081882 A1* | 4/2005 | Greer et al. | 134/1.1 |
| 2005/0110142 A1 | 5/2005 | Lane et al. | 257/751 |
| 2005/0186341 A1 | 8/2005 | Hendrix et al. | 427/248.1 |

FOREIGN PATENT DOCUMENTS

| | | |
|---|---|---|
| WO | WO0026432 A1 | 5/2000 |
| WO | WO2005034223 A1 | 4/2005 |

OTHER PUBLICATIONS

European Patent Office, International Search Report and Written Opinion, Aug. 8, 2006, 10 pp.

European Patent Office, International Search Report and Written Opinion of corresponding PCT Application No. PCT/US2006/007675, dated Oct. 13, 2006, 9 pages.

* cited by examiner

METHOD AND DEPOSITION SYSTEM FOR INCREASING DEPOSITION RATES OF METAL LAYERS FROM METAL-CARBONYL PRECURSORS

CROSS REFERENCE TO RELATED APPLICATIONS

The present invention is related to U.S. patent application Ser. No. 10/996,145, entitled METHOD FOR INCREASING DEPOSITION RATES OF METAL LAYERS FROM METAL-CARBONYL PRECURSORS and filed on Nov. 23, 2004, the entire content of which is herein incorporated by reference. The related application is not commonly-owned.

FIELD OF THE INVENTION

The present invention relates to semiconductor processing, and more particularly, to a method and a deposition system for increasing deposition rates of metal layers from metal-carbonyl precursors.

BACKGROUND OF THE INVENTION

The introduction of copper (Cu) metal into multilayer metallization schemes for manufacturing integrated circuits can necessitate the use of diffusion barriers/liners to promote adhesion and growth of the Cu layers and to prevent diffusion of Cu into the dielectric materials. Barriers/liners that are deposited onto dielectric materials can include refractive materials, such as tungsten (W), molybdenum (Mo), and tantalum (Ta), that are non-reactive and immiscible in Cu, and can offer low electrical resistivity. Current integration schemes that integrate Cu metallization and dielectric materials can require barrier/liner deposition processes at substrate temperature between about 400° C. and about 500° C., or lower.

For example, Cu integration schemes for technology nodes less than or equal to 130 nm can utilize a low dielectric constant (low-k) inter-level dielectric, followed by a physical vapor deposition (PVD) Ta layer or a TaN/Ta layer, followed by a PVD Cu seed layer, and an electro-chemical deposition (ECD) Cu fill. Generally, Ta layers are chosen for their adhesion properties (i.e., their ability to adhere on low-k films), and Ta/TaN layers are generally chosen for their barrier properties (i.e., their ability to prevent Cu diffusion into the low-k film).

As described above, significant effort has been devoted to the study and implementation of thin transition metal layers as Cu diffusion barriers, these studies including such materials as chromium, tantalum, molybdenum and tungsten. Each of these materials exhibits low miscibility in Cu. More recently, other materials, such as ruthenium (Ru) and rhodium (Rh) have been identified as potential barrier layers since they are expected to behave similarly to conventional refractory metals. However, the use of Ru or Rh can permit the use of only one barrier layer, as opposed to two layers, such as Ta/TaN. This observation is due to the adhesive and barrier properties of these materials. For example, one Ru layer can replace the Ta/TaN barrier layer. Moreover, current research is finding that the one Ru layer can further replace the Cu seed layer, and bulk Cu fill can proceed directly following Ru deposition. This observation is due to good adhesion between the Cu and the Ru layers.

Conventionally, Ru layers can be formed by thermally decomposing a ruthenium-containing precursor, such as a ruthenium carbonyl precursor, in a thermal chemical vapor deposition (TCVD) process. Material properties of Ru layers that are deposited by thermal decomposition of ruthenium-carbonyl precursors (e.g., $Ru_3(CO)_{12}$) can deteriorate when the substrate temperature is lowered to below about 400° C. As a result, an increase in the (electrical) resistivity of the Ru layers and poor surface morphology (e.g., the formation of nodules) at low deposition temperatures, has been attributed to increased incorporation of reaction by-products into the thermally deposited Ru layers. Both effects can be explained by a reduced carbon monoxide (CO) desorption rate from the thermal decomposition of the ruthenium-carbonyl precursor at substrate temperatures below about 400° C.

Additionally, the use of metal-carbonyls, such as ruthenium carbonyl or rhenium carbonyl, can lead to poor deposition rates due to their low vapor pressure, and the transport issues associated therewith. Overall, the inventors have observed that current deposition systems suffer from such a low rate, making the deposition of such metal films impractical.

SUMMARY OF THE INVENTION

The present invention provides a method and a deposition system for increasing deposition rates of metal layers from metal-carbonyl precursors. Embodiments of the invention allow for increasing the evaporation temperature of metal-containing precursors to increase the vapor pressure of the metal-carbonyl precursor, thereby increasing delivery of the metal-carbonyl precursor vapor to the process chamber and increasing the deposition rate of the metal on the substrate. According to an embodiment of the invention, a CO gas is mixed with a metal-carbonyl precursor vapor to reduce premature decomposition of the metal-carbonyl precursor vapor prior to exposing the metal-carbonyl vapor to a substrate. Furthermore, a dilution gas is added to the process gas in the process chamber for controlling and reducing the partial pressure of by-products and CO gas in the process chamber.

Thus, the method includes providing a substrate in a process chamber of a deposition system, forming a process gas containing a metal-carbonyl precursor vapor and a CO gas, introducing the process gas to the process chamber, adding a dilution gas to the process gas in the process chamber to form a diluted process gas, and exposing the substrate to the diluted process gas to deposit a metal layer on the substrate by a thermal chemical vapor deposition process.

Embodiments of the invention include various metal-carbonyl precursors with the general formula $M_x(CO)_y$. The metal-carbonyls include, but are not limited to, $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Ru_3(CO)_{12}$, and $Os_3(CO)_{12}$.

According to an embodiment of the invention, a method is provided for depositing a Ru metal layer on a patterned substrate by providing a patterned substrate in a process chamber of a deposition system, wherein "patterned" refers to the substrate containing one or more vias or trenches, or combinations thereof, forming a process gas from a $Ru_3(CO)_{12}$ precursor vapor and a CO gas, introducing the process gas to the process chamber, adding a dilution gas to the process gas to form a diluted process gas, and exposing the patterned substrate to the diluted process gas to deposit a Ru metal layer on the patterned substrate by a thermal chemical vapor deposition process.

According to an embodiment of the invention, a deposition system is provided for depositing a metal layer on a substrate. The deposition system contains a substrate holder configured for supporting and heating a substrate in a process chamber having a vapor distribution system, a precursor delivery system configured for forming a process gas containing a metal-carbonyl precursor vapor and a CO gas for introducing the process gas to the vapor distribution system, a dilution gas source configured for adding a dilution gas to the process gas in the process chamber, and a controller configured for controlling the deposition system during exposure of the substrate to the diluted process gas to deposit a metal layer on the substrate by a thermal chemical vapor deposition process.

DETAILED DESCRIPTION OF SEVERAL EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1:
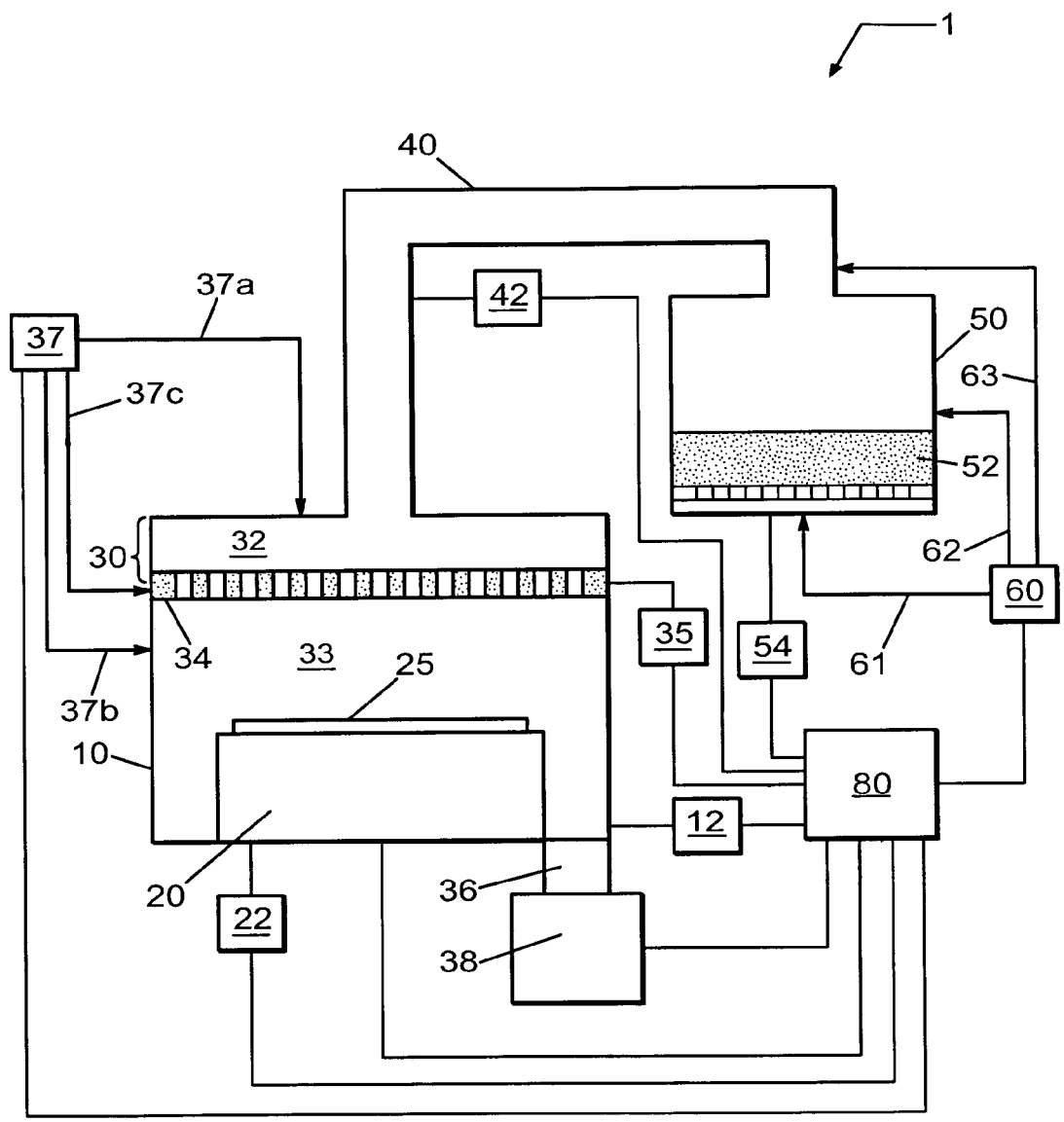
FIG. 1 depicts a schematic view of a deposition system according to an embodiment of the invention.

Referring now to the drawings, wherein like reference numerals designate identical or corresponding parts throughout the several views, FIG. 1 illustrates a deposition system 1 for depositing a metal layer on a substrate from a metal-carbonyl precursor according to one embodiment. The deposition system 1 comprises a process chamber 10 having a substrate holder 20 configured to support a substrate 25, upon which the metal layer is formed. The process chamber 10 is coupled to a metal precursor evaporation system 50 via a vapor precursor delivery system 40.

The process chamber 10 is further coupled to a vacuum pumping system 38 through a duct 36, wherein the pumping system 38 is configured to evacuate the process chamber 10, vapor precursor delivery system 40, and metal precursor evaporation system 50 to a pressure suitable for forming the metal layer on the substrate 25, and suitable for evaporation of the metal-carbonyl precursor 52 in the metal precursor evaporation system 50.

Still referring to FIG. 1, the metal precursor evaporation system 50 is configured to store a metal-carbonyl precursor 52, and heat the metal-carbonyl precursor 52 to a temperature sufficient for evaporating the metal-carbonyl precursor 52 and introducing metal-carbonyl precursor vapor to the vapor precursor delivery system 40. The metal-carbonyl precursor 52 can be solid under the selected heating conditions in the metal precursor evaporation system 50. Alternately, the metal-carbonyl precursor 52 can be a liquid. Below, using a solid metal-carbonyl precursor 52 is described, however, those skilled in the art will appreciate that metal-carbonyl precursors that are liquids under the selected heating conditions can be used without departing from the scope of the invention. For instance, the metal-carbonyl precursor can have the general formula $M_x(CO)_y$, and can comprise a tungsten-carbonyl, a molybdenum carbonyl, a cobalt carbonyl, a rhodium carbonyl, a rhenium carbonyl, a chromium carbonyl, or an osmium carbonyl, or a combination of two thereof. These metal-carbonyls include, but are not limited to, $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$, or a combination of two or more thereof.

In order to achieve the desired temperature for evaporating the metal-carbonyl precursor 52 (or subliming the solid metal-carbonyl precursor 52), the metal precursor evaporation system 50 is coupled to an evaporation temperature control system 54 configured to control the evaporation temperature. For instance, the temperature of the metal-carbonyl precursor 52 is generally elevated to approximately 40° C. to 45° C. in conventional systems in order to sublime the ruthenium carbonyl $Ru_3(CO)_{12}$. At this temperature, the vapor pressure of the $Ru_3(CO)_{12}$, for instance, ranges from approximately 1 to approximately 3 mTorr. As the metal-carbonyl precursor is heated to cause evaporation (or sublimation), a carrier gas can be passed over or through the metal-carbonyl precursor 52, or any combination thereof. The carrier gas can include, for example, an inert gas, such as a noble gas, He, Ne, Ar, Kr, or Xe, or a combination of two or more thereof. Alternately, other embodiments contemplate omitting a carrier gas.

According to an embodiment of the invention, a CO gas can be added to the carrier gas. Alternately, other embodiments contemplate the CO gas replacing the carrier gas. For example, a gas supply system 60 is coupled to the metal precursor evaporation system 50, and it is configured to, for instance, supply a carrier gas, a CO gas, or a mixture thereof, beneath the metal-carbonyl precursor 52 via feed line 61, or over the metal-carbonyl precursor 52 via feed line 62. In addition, or in the alternative, the gas supply system 60 is coupled to the vapor precursor delivery system 40 downstream from the metal precursor evaporation system 50 to supply the gas to the vapor of the metal-carbonyl precursor 52 via feed line 63 as or after it enters the vapor precursor delivery system 40. Although not shown, the gas supply system 60 can comprise a carrier gas source, a CO gas source, one or more control valves, one or more filters, and a mass flow controller. For instance, the flow rate of the carrier gas can be between about 0.1 standard cubic centimeters per minute (sccm) and about 1000 sccm. Alternately, the flow rate of the carrier gas can be between about 10 sccm and about 500 sccm. Still alternately, the flow rate of the carrier gas can be between about 50 sccm and about 200 sccm. According to embodiments of the invention, the flow rate of the CO gas can range from approximately 0.1 sccm to approximately 1000 sccm. Alternately, the flow rate of the CO gas can be between about 1 sccm and about 100 sccm.

Downstream from the metal precursor evaporation system 50, the process gas containing the metal-carbonyl precursor vapor flows through the vapor precursor delivery system 40 until it enters the process chamber 10 via a vapor distribution system 30 coupled thereto. The vapor precursor delivery system 40 can be coupled to a vapor line temperature control system 42 in order to control the vapor line temperature and prevent decomposition of the metal-carbonyl precursor vapor as well as condensation of the metal-carbonyl precursor vapor.

Referring again to FIG. 1, the vapor distribution system 30, which forms part of and is coupled to the process chamber 10, comprises a vapor distribution plenum 32 within which the vapor disperses prior to passing through a vapor distribution plate 34 and entering a processing zone 33 above substrate 25. In addition, the vapor distribution plate 34 can be coupled to a distribution plate temperature control system 35 configured to control the temperature of the vapor distribution plate 34.

According to an embodiment of the invention, a dilution gas source 37 is coupled to the process chamber 10 and is configured to add a dilution gas to dilute the process gas containing the metal-carbonyl precursor vapor and the CO gas. As shown in FIG. 1, the dilution gas source 37 can be coupled to the vapor distribution system 30 via feed line 37a and configured to add the dilution gas to the process gas in the vapor distribution plenum 32 before the process gas passes through the vapor distribution plate 34 into the processing zone 33. Alternately, the dilution gas source 37 can be coupled to the process chamber 10 via feed line 37b and configured to add the dilution gas to the process gas in the processing zone 33 above the substrate 25 after the process gas passes through the vapor distribution plate 34. Still alternately, the dilution gas source 37 can be coupled to the vapor distribution system 30 via feed line 37c and configured to add the dilution gas to the process gas in the distribution plate 34. As will be appreciated by those skilled in the art, the dilution gas can be added to the process gas at other locations in the vapor distribution system 30 and the process chamber 10 without departing from the scope of the invention.

Once the process gas containing the metal-carbonyl precursor vapor enters the processing zone 33 of process chamber 10, the metal-carbonyl precursor vapor thermally decomposes upon adsorption at the substrate surface due to the elevated temperature of the substrate 25, and a metal film is formed on the substrate 25. The substrate holder 20 is configured to elevate the temperature of the substrate 25 by virtue of substrate holder 20 being coupled to a substrate temperature control system 22. For example, the substrate temperature control system 22 can be configured to elevate the temperature of the substrate 25 up to approximately 500° C. Additionally, the process chamber 10 can be coupled to a chamber temperature control system 12 configured to control the temperature of the chamber walls.

As described above, for example, conventional systems have contemplated operating the metal precursor evaporation system 50, as well as the vapor precursor delivery system 40, within a temperature range of approximately 40° C. to 45° C. for $Ru_3(CO)_{12}$ in order to prevent decomposition, which occurs at higher temperatures. For example, $Ru_3(CO)_{12}$ can decompose at elevated temperatures to form by-products, such as those illustrated below:

$$Ru_3(CO)_{12}(ad) \Leftrightarrow Ru_3(CO)_x(ad) + (12-x)CO(g) \qquad (1)$$

or, $$Ru_3(CO)_x(ad) \Leftrightarrow 3Ru(s) + xCO(g) \qquad (2)$$

wherein these by-products can adsorb (ad), i.e., condense, on the interior surfaces of the deposition system 1. The accumulation of material on these surfaces can cause problems from one substrate to the next, such as process repeatability. Alternatively, for example, $Ru_3(CO)_{12}$ can condense on the internal surfaces of the deposition system 1, viz.

$$Ru_3(CO)_{12}(g) \Leftrightarrow Ru_3(CO)_{12}(ad) \qquad (3).$$

In summary, low vapor pressure of some metal-carbonyl precursors (e.g., $Ru_3(CO)_{12}$) and the small process window, results in very low deposition rate of a metal layer on the substrate 25.

The inventors of related U.S. patent application Ser. No. 10/996,145, entitled METHOD FOR INCREASING DEPOSITION RATES OF METAL LAYERS FROM METAL-CARBONYL PRECURSORS and filed on even date herewith, which inventors include the inventor of the present application, realized that adding a CO gas to the metal-carbonyl precursor vapor can reduce the above-mentioned problems that limit the delivery of the metal-carbonyl precursor to the substrate. Thus, according to an embodiment of the invention, the CO gas is added to the metal-carbonyl precursor vapor to reduce dissociation of the metal-carbonyl precursor vapor in the gas line, thereby shifting the equilibrium in Equation (1) to the left and reducing premature decomposition of the metal-carbonyl precursor in the vapor precursor delivery system 40 prior to delivery of the metal-carbonyl precursor to the process chamber 10. It is believed that addition of the CO gas to the metal-carbonyl precursor vapor allows for increasing the evaporation temperature from approximately 40° C. to approximately 150° C., or higher. The elevated temperature increases the vapor pressure of the metal-carbonyl precursor, resulting in increased delivery of the metal-carbonyl precursor to the process chamber and, hence, increased deposition rate of the metal on the substrate 25. Furthermore, the inventors have visually observed that flowing a mixture of Ar and the CO gas over or through the metal-carbonyl precursor reduces premature decomposition of the metal-carbonyl precursor.

According to an embodiment of the invention, the addition of CO gas to a $Ru_3(CO)_{12}$ precursor vapor allows for maintaining the $Ru_3(CO)_{12}$ precursor evaporation temperature from approximately 40° C. to approximately 150° C. Alternately, the evaporation temperature can be maintained at approximately 60° C. to approximately 90° C.

Thermal decomposition of metal-carbonyl precursors and subsequent metal deposition on the substrate 25 is thought to proceed predominantly by CO elimination and desorption of CO by-products from the substrate 25. Incorporation of CO by-products into the metal layers during deposition can result from incomplete decomposition of the metal-carbonyl precursor, incomplete removal of CO by-products from the metal layer, and re-adsorption of CO by-products from the process chamber 10 onto the metal layer.

It is believed that CO incorporation into a metal layer during deposition leads to surface roughness in the form of nodules in the metal layer, where the growth of nodules is enhanced by increased incorporation of CO by-products into the metal layer. The number of nodules is expected to increase as the thickness of the metal layer increases. Furthermore, the incorporation of CO by-products into the metal layer increases the resistivity of the metal layer.

Incorporation of CO-byproducts into the metal layer can be reduced by (1) lowering the process pressure, and (2) increasing the substrate temperature. The current inventor has realized that the above-mentioned problems can also be reduced by adding a dilution gas in the process chamber 10 to the process gas containing the metal-carbonyl precursor vapor and the CO gas for controlling and reducing the partial pressure of by-products and the CO gas in the process chamber. Thus, according to an embodiment of the invention, a dilution gas from dilution gas source 37 is added to the process gas for controlling and reducing the partial pressure of CO by-products on the metal layer and the partial pressure of CO in the process chamber 10, thereby forming a smooth metal layer. The dilution gas can include, for example, an inert gas, such as a noble gas, He, Ne, Ar, Kr, or Xe, or a mixture of two or more thereof. The dilution gas may further contain a reducing gas to improve the material properties of the metal layer, for example the electrical resistivity. The reducing gas can, for example, contain $H_2$, a silicon-containing gas (e.g., $SiH_4$, $Si_2H_6$, or $SiCl_2H_2$), a boron-containing gas ($BH_3$, $B_2H_6$, or $B_3H_9$), or a nitrogen-containing gas (e.g., $NH_3$). According to an embodiment of the invention, the process chamber pressure can be between about 0.1 mTorr and about 200 mTorr. Alternately, the process chamber pressure can be between about 1 mTorr and about 100 mTorr. Still alternately, the process chamber pressure can be between about 2 mTorr and about 50 mTorr.

Since the addition of the CO gas to the metal-carbonyl precursor vapor increases the thermal stability of the metal-carbonyl precursor vapor, the relative concentration of the metal-carbonyl precursor vapor to the CO gas in the process gas can be utilized to control the decomposition rate of the metal-carbonyl precursor on the substrate 25 at a certain substrate temperature. Furthermore, the substrate temperature can be utilized to control the decomposition rate (and thereby the deposition rate) of the metal on the substrate 25. As those skilled in the art will readily appreciate, the amount of CO gas and the substrate temperature can easily be varied to allow for a desired evaporation temperature of the metal-carbonyl precursor and for achieving a desired deposition rate of the metal-carbonyl precursor on the substrate 25.

Furthermore, the amount of CO gas in the process gas can be selected so that metal deposition on the substrate 25 from a metal-carbonyl precursor occurs in a kinetic-limited temperature regime. For example, the amount of CO gas in the process gas can be increased until the metal deposition process is observed to occur in a kinetic-limited temperature regime. A kinetic-limited temperature regime refers to the range of deposition conditions where the deposition rate of a chemical vapor deposition process is limited by the kinetics of the chemical reactions at the substrate surface, typically characterized by a strong dependence of deposition rate on temperature. Unlike the kinetic-limited temperature regime, a mass-transfer limited regime is normally observed at higher substrate temperatures and includes a range of deposition conditions where the deposition rate is limited by the flux of chemical reactants to the substrate surface. A mass-transfer limited regime is characterized by a strong dependence of deposition rate on metal-carbonyl precursor flow rate and and is independent of deposition temperature. Metal deposition in the kinetic-limited regime normally results in good step coverage and good conformality of the metal layer on patterned substrates. Conformality is commonly defined as the thinnest part of the metal layer on the sidewall of a feature on the patterned substrate divided by the thickest part of the metal layer on the sidewall. Step coverage is commonly defined as the sidewall coverage (metal layer thickness on sidewall divided by the metal layer thickness away from the feature) divided by the bottom coverage (metal layer thickness on the bottom of the feature divided by the metal layer thickness away from the feature).

Still referring the FIG. 1, the deposition system 1 can further include a control system 80 configured to operate and control the operation of the deposition system 1. The control system 80 is coupled to the process chamber 10, the substrate holder 20, the substrate temperature control system 22, the chamber temperature control system 12, the vapor distribution system 30, the vapor precursor delivery system 40, the metal precursor evaporation system 50, the dilution gas supply 37, and the gas supply system 60.

Figure 2:
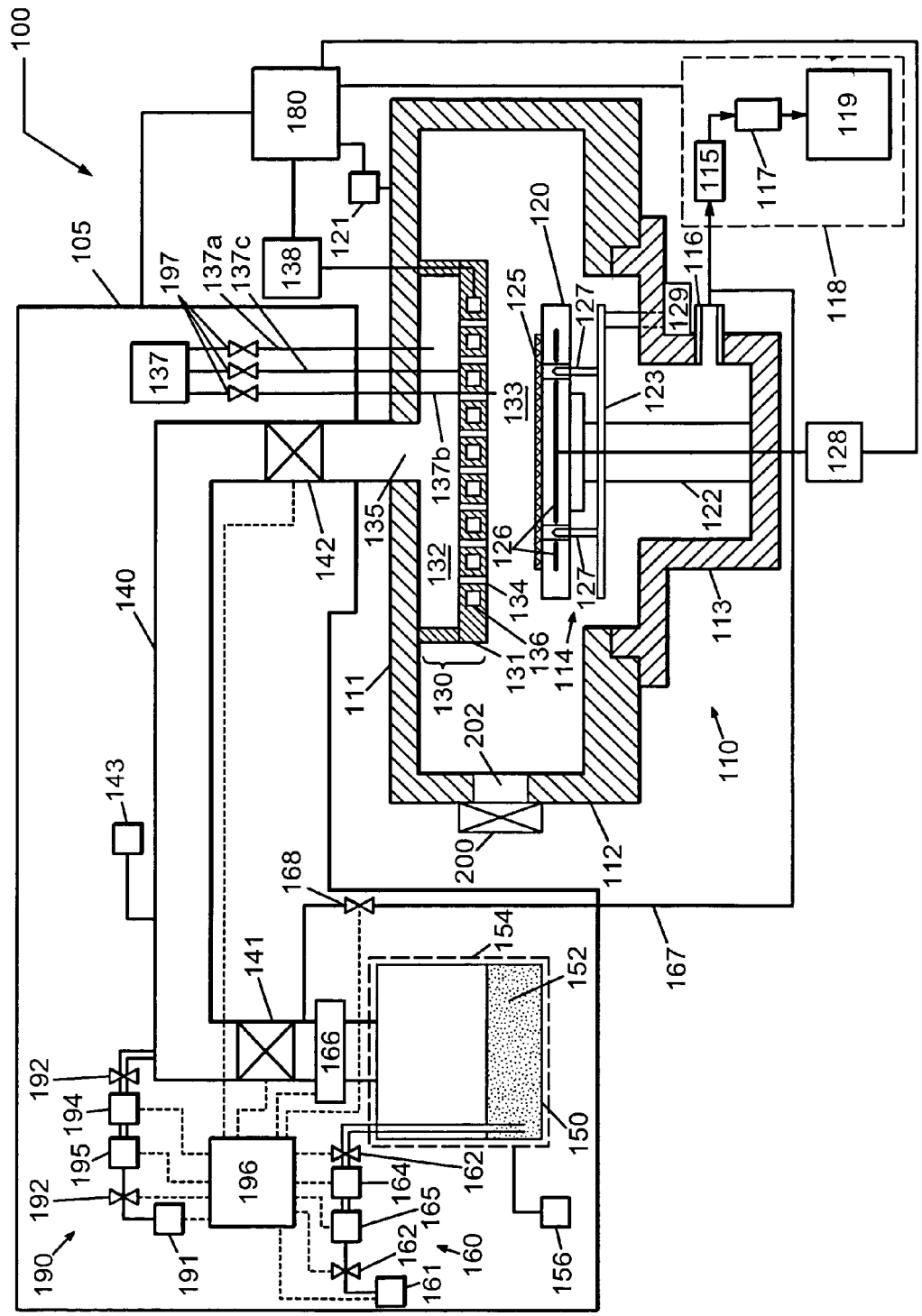
FIG. 2 depicts a schematic view of a deposition system according to another embodiment of the invention.

In another embodiment, FIG. 2 illustrates a deposition system 100 for depositing a metal film, such as a ruthenium (Ru), on a substrate. The deposition system 100 comprises a process chamber having a substrate holder 120 configured to support a substrate 125, upon which the metal layer is formed. The process chamber 110 is coupled to a precursor delivery system 105 having metal precursor evaporation system 150 configured to store and evaporate a metal-carbonyl precursor 152, and a vapor precursor delivery system 140 configured to transport the metal-carbonyl precursor 152 to the process chamber 110.

The process chamber 110 comprises an upper chamber section 111, a lower chamber section 112, and an exhaust chamber 113. An opening 114 is formed within lower chamber section 112, where bottom section 112 couples with exhaust chamber 113.

Still referring to FIG. 2, substrate holder 120 provides a horizontal surface to support substrate (or wafer) 125, which is to be processed. The substrate holder 120 can be supported by a cylindrical support member 122, which extends upward from the lower portion of exhaust chamber 113. Furthermore, the substrate holder 120 comprises a heater 126 coupled to substrate holder temperature control system 128. The heater 126 can, for example, include one or more resistive heating elements. Alternately, the heater 126 can, for example, include a radiant heating system, such as a tungsten-halogen lamp. The substrate holder temperature control system 128 can include a power source for providing power to the one or more heating elements, one or more temperature sensors for measuring the substrate temperature, or the substrate holder temperature, or both, and a controller configured to perform at least one of monitoring, adjusting, or controlling the temperature of the substrate or substrate holder.

During processing, the heated substrate 125 can thermally decompose the metal-carbonyl precursor vapor, and enable deposition of a metal layer on the substrate 125. According to an embodiment, the metal-carbonyl precursor 152 can be a ruthenium-carbonyl precursor, for example $Ru_3(CO)_{12}$. As will be appreciated by those skilled in the art of thermal chemical vapor deposition, other ruthenium carbonyl precursors can be used without departing from the scope of the invention. The substrate holder 120 is heated to a pre-determined temperature that is suitable for depositing the desired Ru metal layer or other metal layer onto the substrate 125. Additionally, a heater (not shown), coupled to a chamber temperature control system 121, can be embedded in the walls of process chamber 110 to heat the chamber walls to a pre-determined temperature. The heater can maintain the temperature of the walls of process chamber 110 from about 40° C. to about 150° C., or from about 40° C. to about 80° C. A pressure gauge (not shown) is used to measure the process chamber pressure. According to an embodiment of the invention, the process chamber pressure can be between about 0.1 mTorr and about 200 mTorr. Alternately, the process chamber pressure can be between about 1 mTorr and about 100 mTorr. Still alternately, the process chamber pressure can be between about 2 mTorr and about 50 mTorr.

Also shown in FIG. 2, a vapor distribution system 130 is coupled to the upper chamber section 111 of process chamber 110. Vapor distribution system 130 comprises a vapor distribution plate 131 configured to introduce precursor vapor from vapor distribution plenum 132 to a processing zone 133 above substrate 125 through one or more orifices 134.

According to an embodiment of the invention, a dilution gas source 137 is coupled to the process chamber 110 and is configured to add a dilution gas to dilute the process gas containing the metal-carbonyl precursor vapor and the CO gas using feed lines 137a, 137b, and/or 137c, valves 197, one or more filters (not shown), and a mass flow controller (not shown). As shown in FIG. 1, the dilution gas source 137 can be coupled to the vapor distribution system 130 of process chamber 110 and is configured to add the dilution gas to the process gas in the vapor distribution plenum 132 via feed line 137*a* before the process gas passes through the vapor distribution plate 131 into the processing zone 133 above the substrate 125, or the dilution gas source 137 can be configured to add the dilution gas to the process gas inside the vapor distribution plate 131 via feed line 137*c*. Alternately, the dilution gas source 137 can be coupled to the process chamber 110 and is configured to add the dilution gas to the process gas in the processing zone 133 via feed line 137*b* after the process gas passes through the vapor distribution plate 131. As will be appreciated by those skilled in the art, the dilution gas can be added to the process gas at other locations in the process chamber 110 without departing from the scope of the invention.

Furthermore, an opening 135 is provided in the upper chamber section 111 for introducing a metal-carbonyl precursor vapor from vapor precursor delivery system 140 into vapor distribution plenum 132. Moreover, temperature control elements 136, such as concentric fluid channels configured to flow a cooled or heated fluid, are provided for controlling the temperature of the vapor distribution system 130, and thereby prevent the decomposition or condensation of the metal-carbonyl precursor inside the vapor distribution system 130. For instance, a fluid, such as water, can be supplied to the fluid channels from a vapor distribution temperature control system 138. The vapor distribution temperature control system 138 can include a fluid source, a heat exchanger, one or more temperature sensors for measuring the fluid temperature or vapor distribution plate temperature or both, and a controller configured to control the temperature of the vapor distribution plate 131 from about 20° C. to about 150° C.

As illustrated in FIG. 2, a metal precursor evaporation system 150 is configured to hold a metal-carbonyl precursor 152 and evaporate (or sublime) the metal-carbonyl precursor 152 by elevating the temperature of the metal-carbonyl precursor. A precursor heater 154 is provided for heating the metal-carbonyl precursor 152 to maintain the metal-carbonyl precursor 152 at a temperature that produces a desired vapor pressure of metal-carbonyl precursor 152. The precursor heater 154 is coupled to an evaporation temperature control system 156 configured to control the temperature of the metal-carbonyl precursor 152. For example, the precursor heater 154 can be configured to adjust the temperature of the metal-carbonyl precursor 152 from about 40° C. to about 150° C., or from about 60° C. to about 90° C.

As the metal-carbonyl precursor 152 is heated to cause evaporation (or sublimation), a carrier gas can be passed over or through the metal-carbonyl precursor 152, or any combination thereof. The carrier gas can include, for example, an inert gas, such as a noble gas (i.e., He, Ne, Ar, Kr, Xe). Alternately, other embodiments contemplate omitting a carrier gas. According to an embodiment of the invention, a CO gas can be added to the carrier gas. Alternately, other embodiments contemplate the CO gas replacing the carrier gas. For example, a gas supply system 160 is coupled to the metal precursor evaporation system 150, and it is configured to, for instance, flow the carrier gas, the CO gas, or both, over or through the metal-carbonyl precursor 152. Although not shown in FIG. 2, gas supply system 160 can also or alternatively be coupled to the vapor precursor delivery system 140 to supply the carrier gas and/or CO gas to the vapor of the metal precursor 152 as or after it enters the vapor precursor delivery system 140. The gas supply system 160 can comprise a gas source 161 containing a carrier gas, a CO gas, or a mixture thereof, one or more control valves 162, one or more filters 164, and a mass flow controller 165. For instance, the mass flow rate of carrier gas or the CO gas can range from approximately 0.1 sccm to approximately 1000 sccm.

Additionally, a sensor 166 is provided for measuring the total gas flow from the metal precursor evaporation system 150. The sensor 166 can, for example, comprise a mass flow controller, and the amount of metal-carbonyl precursor vapor delivered to the process chamber 110, can be determined using sensor 166 and mass flow controller 165. Alternately, the sensor 166 can comprise a light absorption sensor to measure the concentration of the metal-carbonyl precursor in the gas flow to the process chamber 110.

A bypass line 167 can be located downstream from sensor 166, and it can connect the vapor delivery system 140 to an exhaust line 116. Bypass line 167 is provided for evacuating the vapor precursor delivery system 140, and for stabilizing the supply of the metal-carbonyl precursor to the process chamber 110. In addition, a bypass valve 168, located downstream from the branching of the vapor precursor delivery system 140, is provided on bypass line 167.

Referring still to FIG. 2, the vapor precursor delivery system 140 comprises a high conductance vapor line having first and second valves 141 and 142 respectively. Additionally, the vapor precursor delivery system 140 can further comprise a vapor line temperature control system 143 configured to heat the vapor precursor delivery system 140 via heaters (not shown). The temperatures of the vapor lines can be controlled to avoid condensation of the metal-carbonyl precursor vapor in the vapor line. The temperature of the vapor lines can be controlled from about 20° C. to about 100° C., or from about 40° C. to about 90° C.

Moreover, a CO gas can be supplied from a gas supply system 190. For example, the gas supply system 190 is coupled to the vapor precursor delivery system 140, and it is configured to, for instance, mix the CO gas with the metal-carbonyl precursor vapor in the vapor precursor delivery system, for example, downstream of valve 141. The gas supply system 190 can comprise a CO gas source 191, one or more control valves 192, one or more filters 194, and a mass flow controller 195. For instance, the mass flow rate of CO gas can range from approximately 0.1 sccm (standard cubic centimeters per minute) to approximately 1000 sccm.

Mass flow controllers 165 and 195, and valves 162, 192, 168, 141, and 142 are controlled by controller 196, which controls the supply, shutoff, and the flow of the carrier gas, the CO gas, and the metal-carbonyl precursor vapor. Sensor 166 is also connected to controller 195 and, based on output of the sensor 166, controller 195 can control the carrier gas flow through mass flow controller 165 to obtain the desired metal-carbonyl precursor flow to the process chamber 110.

As illustrated in FIG. 2, the exhaust line 116 connects exhaust chamber 113 to pumping system 118. A vacuum pump 119 is used to evacuate process chamber 110 to the desired degree of vacuum, and to remove gaseous species from the process chamber 110 during processing. An automatic pressure controller (APC) 115, and a trap 117 can be used in series with the vacuum pump 119. The vacuum pump 119 can include a turbo-molecular pump (TMP) capable of a pumping speed up to 500 liters per second (and greater). Alternately, the vacuum pump 119 can include a dry roughing pump. During processing, the process gas can be introduced into the process chamber 110, and the chamber pressure can be adjusted by the APC 115. The APC 115 can comprise a butterfly-type valve, or a gate valve. The trap 117 can collect unreacted metal-carbonyl precursor material, and by-products from the process chamber 110.

Referring back to the substrate holder 120 in the process chamber 110, as shown in FIG. 2, three substrate lift pins 127 (only two are shown) are provided for holding, raising, and lowering the substrate 125. The substrate lift pins 127 are coupled to plate 123, and can be lowered to below to the upper surface of substrate holder 120. A drive mechanism 129 utilizing, for example, an air cylinder provides means for raising and lowering the plate 123. Substrate 125 can be transferred into and out of process chamber 110 through gate valve 200 and chamber feed-through passage 202 via a robotic transfer system (not shown), and received by the substrate lift pins 127. Once the substrate 125 is received from the transfer system, it can be lowered to the upper surface of the substrate holder 120 by lowering the substrate lift pins 127.

Still referring to FIG. 2, a controller 180 includes a microprocessor, a memory, and a digital I/O port capable of generating control voltages sufficient to communicate and activate inputs of the processing system 100 as well as monitor outputs from the processing system 100. Moreover, the processing system controller 180 is coupled to and exchanges information with process chamber 110; precursor delivery system 105, which includes controller 196, vapor line temperature control system 143, and evaporation temperature control system 156; vapor distribution temperature control system 138; vacuum pumping system 118; and substrate temperature control system 128. In the vacuum pumping system 118, the controller 180 is coupled to and exchanges information with the automatic pressure controller 115 for controlling the pressure in the process chamber 110. A program stored in the memory is utilized to control the aforementioned components of deposition system 100 according to a stored process recipe. One example of processing system controller 180 is a DELL PRECISION WORKSTATION 610™, available from Dell Corporation, Dallas, Tex. The controller 180 may also be implemented as a general-purpose computer, digital signal process, etc.

Controller 180 may be locally located relative to the deposition system 100, or it may be remotely located relative to the deposition system 100 via an internet or intranet. Thus, controller 180 can exchange data with the deposition system 100 using at least one of a direct connection, an intranet, or the internet. Controller 180 may be coupled to an intranet at a customer site (i.e., a device maker, etc.), or coupled to an intranet at a vendor site (i.e., an equipment manufacturer). Furthermore, another computer (i.e., controller, server, etc.) can access controller 180 to exchange data via at least one of a direct connection, an intranet, or the internet.

Figure 3:
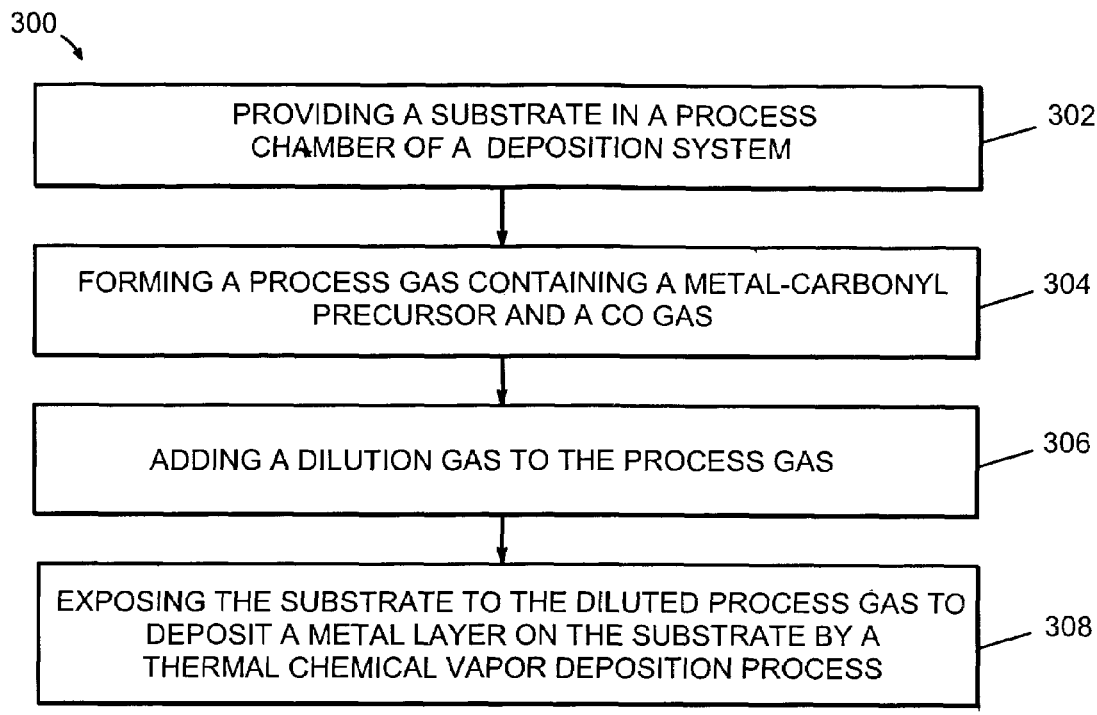
FIG. 3 illustrates a method of depositing a metal layer on a substrate according to an embodiment of the invention.

FIG. 3 illustrates a method of depositing a metal layer on a substrate according to an embodiment of the invention. The method 300 includes, at 302, providing a substrate in a process chamber of a deposition system. For example, the deposition system can include the depositions systems described above in FIGS. 1 and 2. The substrate can, for example, be a Si substrate. A Si substrate can be of n- or p-type, depending on the type of device being formed. The substrate can be of any size, for example a 200 mm substrate, a 300 mm substrate, or an even larger substrate. According to an embodiment of the invention, the substrate can be a patterned substrate containing one or more vias or trenches, or combinations thereof. At 304, a process gas containing a metal-carbonyl precursor vapor and a CO gas is formed. The process gas can further contain a carrier gas. As described above, according to one embodiment, the metal-carbonyl precursor can be a ruthenium-carbonyl precursor, for example $Ru_3(CO)_{12}$. Addition of the CO gas to the metal-carbonyl precursor vapor allows for increasing the evaporation temperature of metal-carbonyl precursor. The elevated temperature increases the vapor pressure of the metal-carbonyl precursor, resulting in increased delivery of the metal-carbonyl precursor to the process chamber and, hence, increased deposition rate of the metal on a substrate.

According to an embodiment of the invention, the process gas can be formed by heating a metal-carbonyl precursor to form the metal-carbonyl precursor vapor, and mixing the CO gas with the metal-carbonyl precursor vapor. According to an embodiment of the invention, the CO gas can be mixed with the metal-carbonyl precursor vapor downstream from the metal-carbonyl precursor. According to another embodiment of the invention, the CO gas can be mixed with the metal-carbonyl precursor vapor by flowing the CO gas over or through the metal-carbonyl precursor. According to yet another embodiment of the invention, the process gas can be formed by additionally flowing a carrier gas over or through the solid metal-carbonyl precursor.

At 306, a dilution gas is added to the process gas in the process chamber to form a diluted process gas. As described in FIGS. 1 and 2, the dilution gas can be added to the process gas in a vapor distribution plenum before the process gas passes through a vapor distribution plate into a processing zone above the substrate. Alternately, the dilution gas can be added to the process gas in the processing zone above the substrate after the process gas flows through the vapor distribution plate. Still alternately, the dilution gas can be added to the process gas in the vapor distribution plate.

At 308, the substrate is exposed to the diluted process gas to deposit a metal layer on the substrate by a thermal chemical vapor deposition process. According to an embodiment of the invention, the metal layer can be deposited at a substrate temperature between about 50° C. and about 500° C. Alternately, the substrate temperature can be between about 300° C. and about 400° C.

As would be appreciated by those skilled in the art, each of the steps or stages in the flowchart of FIG. 3 may encompass one or more separate steps and/or operations. Accordingly, the recitation of only four steps in 302, 304, 306, 308 should not be understood to limit the method of the present invention solely to four steps or stages. Moreover, each representative step or stage 302, 304, 306, 308 should not be understood to be limited to only a single process.

Figure 4A:
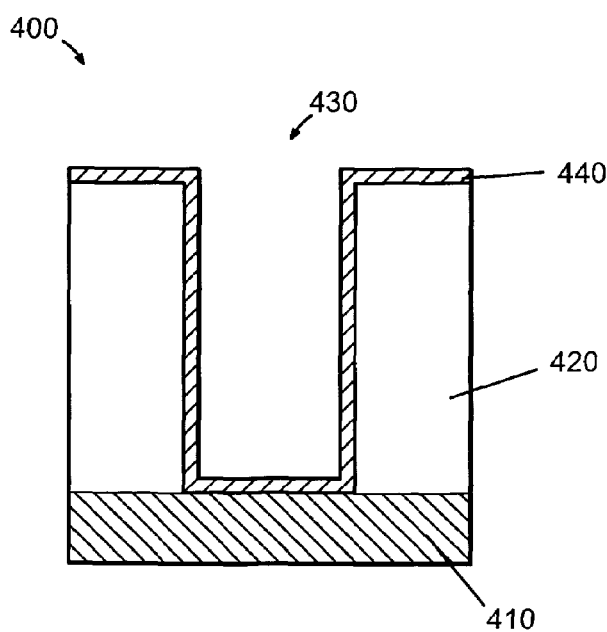
FIGS. 4A-4C schematically show formation of a metal layer on a patterned substrate according to embodiments of the invention.
Figure 4B:
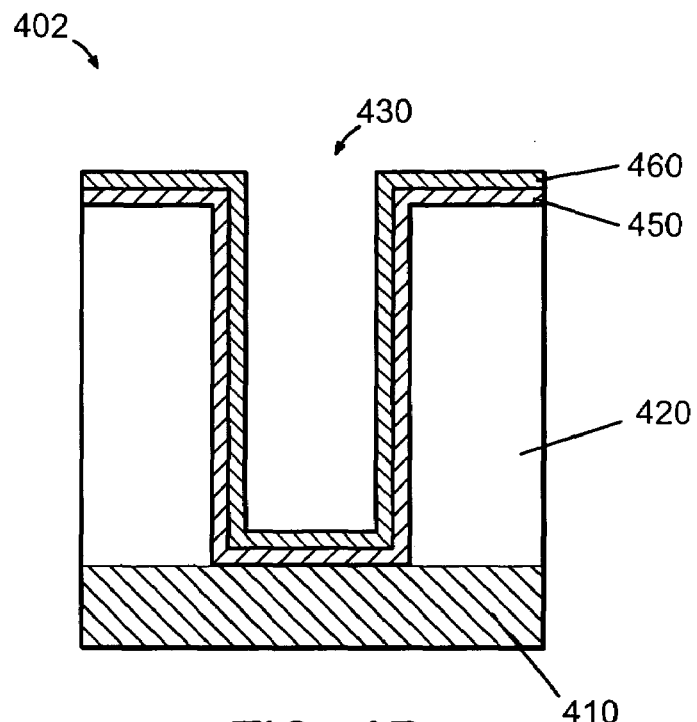
Figure 4C:
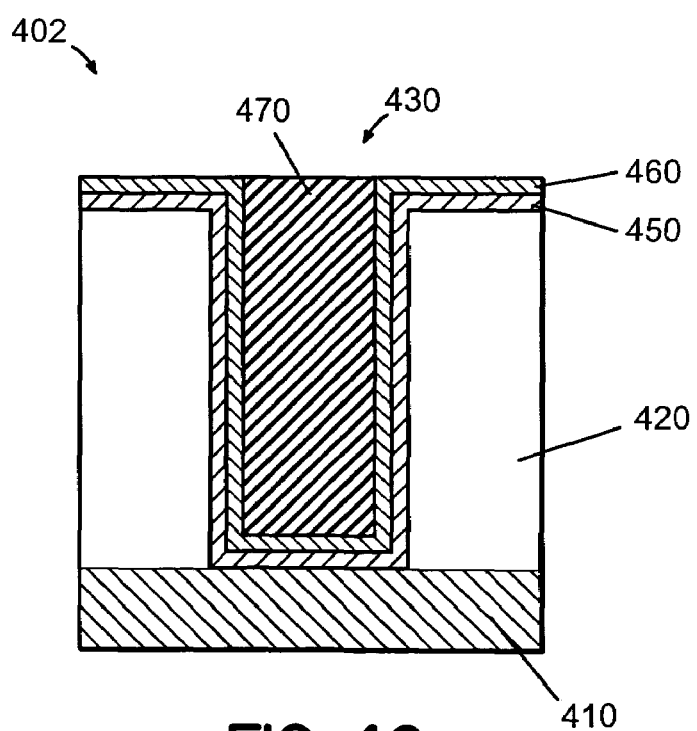

FIGS. 4A-4C schematically show formation of a metal layer on a patterned substrate according to embodiments of the invention. As those skilled in the art will readily appreciate, embodiments of the invention can be applied to patterned substrates containing one or more vias or trenches, or combinations thereof. FIG. 4A schematically shows deposition of a metal layer 440 onto a patterned structure 400 according to an embodiment of the invention. The patterned structure 400 contains a first metal layer 410, and a patterned layer 420 containing an opening 430. The patterned layer 420 can, for example, be a dielectric material. The opening 430 can, for example, be a via or a trench, and the metal layer 440 can, for example, contain Ru metal.

FIG. 4B schematically shows deposition of a metal layer 460 onto a patterned structure 402 according to another embodiment of the invention. The patterned structure 402 contains a first metal layer 410 and a patterned layer 420 containing an opening 430. A barrier layer 450 is deposited onto the patterned structure 402, and a metal layer 460 is deposited on the barrier layer 450. The barrier layer 450 can, for example, contain a tantalum-containing material (e.g., Ta, TaN, or TaCN, or a combination of two or more thereof) or a tungsten material (e.g., W, WN). The patterned layer 420 can, for example, be a dielectric material. The opening 430 can, for example, be a via or a trench, and the metal layer 460 can, for example, contain Ru metal. FIG. 4C schematically shows deposition of Cu in the opening 430 of FIG. 4B.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of depositing a metal layer on a substrate, the method comprising:

providing a substrate in a process chamber of a deposition system, wherein the process chamber comprises a vapor distribution system positioned adjacent an inlet of the process chamber and a processing zone between the vapor distribution system and the substrate, the vapor distribution system comprising a vapor distribution plate adjacent the processing zone and a vapor distribution plenum between the inlet and the vapor distribution plate;

forming a process gas containing a metal-carbonyl precursor vapor and a carbon monoxide CO gas by:

heating a solid metal-carbonyl precursor in a precursor vaporization system to form the metal-carbonyl precursor vapor, and flowing the CO gas in contact with the solid metal-carbonyl precursor in the precursor vaporization system during the heating to capture the metal-carbonyl precursor vapor in the CO gas as the vapor is being formed;

transporting the process gas from the precursor vaporization system to the inlet of the process chamber and introducing the process gas through the vapor distribution system and into the processing zone of the process chamber;

adding a dilution gas to the process gas in the process chamber to form a diluted process gas; and exposing the substrate to the diluted process gas to deposit a metal layer on the substrate by a thermal chemical vapor deposition process.

2. The method according to claim 1, wherein a flow of the CO gas is between about 0.1 sccm and about 1000 sccm.

3. The method according to claim 1, wherein a flow of the CO gas is between about 1 sccm and about 100 sccm.

4. The method according to claim 1, wherein the forming further comprises:

flowing a carrier gas over or through the metal-carbonyl precursor.

5. The method according to claim 4, wherein the carrier gas comprises a noble gas.

6. The method according to claim 4, wherein a flow of the carrier gas is between about 0.1 sccm and about 1000 sccm.

7. The method according to claim 1, wherein the metal-carbonyl precursor vapor comprises a tungsten-carbonyl, a molybdenum-carbonyl, a cobalt-carbonyl, a rhodium-carbonyl, a rhenium-carbonyl, a chromium-carbonyl, a ruthenium-carbonyl, or an osmium-carbonyl, or a combination of two or more thereof.

8. The method according to claim 1, wherein the metal-carbonyl precursor vapor comprises $W(CO)_6$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$, or a combination of two or more thereof.

9. The method according to claim 1, further comprising maintaining the substrate at a temperature between about 50° C. and about 500° C. during the exposing.

10. The method according to claim 1, further comprising maintaining the substrate at a temperature between about 300° C. and about 400° C. during the exposing.

11. The method according to claim 1, further comprising maintaining the process chamber at a pressure between about 0.1 mTorr and about 200 mTorr during the exposing.

12. The method according to claim 1, further comprising maintaining the process chamber at a pressure between about 1 mTorr and about 100 mTorr during the exposing.

13. The method according to claim 1, further comprising maintaining the process chamber at a pressure between about 2 mTorr and about 50 mTorr during the exposing.

14. The method according to claim 1, wherein the adding comprises:

adding the dilution gas to the process gas in the vapor distribution plenum; and flowing the diluted process gas through the vapor distribution plate of the vapor distribution system to the processing zone.

15. The method according to claim 1, wherein the adding comprises:

adding the dilution gas to the process gas in the processing zone after the process gas flows through the vapor distribution plate.

16. The method according to claim 1, wherein the adding comprises:

adding the dilution gas to the process gas inside the vapor distribution plate.

17. The method according to claim 1, wherein the dilution gas comprises a noble gas.

18. The method according to claim 17, wherein the dilution gas further comprises a reducing gas.

19. The method according to claim 18, wherein the reducing gas comprises $H_2$, a silicon-containing gas, a boron-containing gas, or a nitrogen-containing gas, or a combination of two or more thereof.

20. The method according to claim 1, wherein the substrate is a patterned substrate containing one or more vias or trenches, or combinations thereof.

21. The method according to claim 1, wherein the forming further comprises:

utilizing the relative concentration of the metal-carbonyl precursor vapor to the CO gas to control the decomposition rate of the metal-carbonyl precursor on the substrate.

22. The method according to claim 1, wherein the exposing further comprises:

performing the thermal chemical vapor deposition process in a kinetic-limited temperature regime.

23. A method of depositing a Ru metal layer on a patterned substrate, the method comprising:

providing a patterned substrate in a process chamber of a deposition system, wherein the patterned substrate contains one or more vias or trenches, or combinations thereof, and wherein the process chamber comprises a vapor distribution system positioned adjacent an inlet of the process chamber and a processing zone between the vapor distribution system and the substrate, the vapor distribution system comprising a vapor distribution plate adjacent the processing zone and a vapor distribution plenum between the inlet and the vapor distribution plate;

forming a process gas containing $Ru_3(CO)_{12}$ precursor vapor and a carbon monoxide (CO) gas by:
  heating a solid $Ru_3(CO)_{12}$ precursor in a precursor vaporization system to form the $Ru_3CO_{12}$ precursor vapor; and
  flowing the CO gas in contact with the solid $Ru_3(CO)_{12}$ precursor in the precursor vaporization system during the heating to capture the $Ru_3(CO)_{12}$ precursor vapor in the CO gas as the vapor is being formed;
transporting the process gas from the precursor vaporization system to the inlet of the process chamber and introducing the process gas through the vapor distribution system and into the processing zone of the process chamber;
adding a dilution gas to the process gas in at least one of the vapor distribution plenum, the vapor distribution plate or the processing zone to form a diluted process gas in the process chamber; and
exposing the patterned substrate to the diluted process gas to deposit a Ru metal layer on the patterned substrate by a thermal chemical vapor deposition process.

24. The method according to claim 23, wherein a flow of the CO gas is between about 0.1 sccm and about 1000 sccm.

25. The method according to claim 23, wherein a flow of the CO gas is between about 1 sccm and about 100 sccm.

26. The method according to claim 23, wherein the forming further comprises:
  flowing a carrier gas over or through the $Ru_3(CO)_{12}$ precursor.

27. The method according to claim 26, wherein the carrier gas comprises a noble gas.

28. The method according to claim 26, wherein a flow of the carrier gas is between about 0.1 sccm and about 1000 sccm.

29. The method according to claim 23, wherein the heating comprises maintaining the $Ru_3(CO)_{12}$ precursor at a temperature between about 40° C. to about 150° C.

30. The method according to claim 23, wherein the heating comprises maintaining the $Ru_3(CO)_{12}$ precursor at a temperature between about 60° C. to about 90° C.

31. The method according to claim 23, further comprising maintaining the substrate at a temperature between about 50° C. and about 500° C. during the exposing.

32. The method according to claim 23, further comprising maintaining the substrate at a temperature between about 300° C. and about 400° C. during the exposing.

33. The method according to claim 23, further comprising maintaining the process chamber at a pressure between about 0.1 mTorr and about 200 mTorr during the exposing.

34. The method according to claim 23, further comprising maintaining the process chamber at a pressure between about 1 mTorr and about 100 mTorr during the exposing.

35. The method according to claim 23, further comprising maintaining the process chamber at a pressure between about 2 mTorr and about 50 mTorr during the exposing.

36. The method according to claim 23, wherein the adding comprises:
  adding the dilution gas to the process gas in the vapor distribution plenum; and
  flowing the diluted process gas through the vapor distribution plate to the processing zone.

37. The method according to claim 23, wherein the adding comprises:
  adding the dilution gas to the process gas in the processing zone after the process gas flows through the vapor distribution plate.

38. The method according to claim 23, wherein the adding comprises:
  adding the dilution gas to the process gas inside the vapor distribution plate.

39. The method according to claim 23, wherein the dilution gas comprises a noble gas.

40. The method according to claim 23, wherein the dilution gas further comprises a reducing gas.

41. The method according to claim 40, wherein the reducing gas comprises $H_2$, a silicon-containing gas, a boron-containing gas, or a nitrogen-containing gas, or a combination of two or more thereof.

42. The method according to claim 23 wherein the patterned substrate further comprises a barrier layer formed thereon onto which the Ru metal layer is deposited.

43. The method according to claim 42, wherein the barrier layer comprises a tantalum-containing layer or a tungsten-containing layer onto which the Ru metal layer is deposited.

44. The method according to claim 23, wherein the forming further comprises:
  utilizing the relative concentration of the $Ru_3(CO)_{12}$ precursor vapor to the CO gas to control the decomposition rate of the $Ru_3(CO)_{12}$ precursor on the substrate.

45. The method according to claim 23, wherein the exposing further comprises:
  performing the thermal chemical vapor deposition process in a kinetic-limited temperature regime.

* * * * *